United States Patent
Lan

(10) Patent No.: US 11,069,595 B2
(45) Date of Patent: Jul. 20, 2021

(54) WATER COOLING MODULE

(71) Applicant: ASIA VITAL COMPONENTS CO., LTD., New Taipei (TW)

(72) Inventor: Wen-Ji Lan, New Taipei (TW)

(73) Assignee: ASIA VITAL COMPONENTS CO., LTD., New Taipei (TW)

(*) Notice: Subject to any disclaimer, the term of this patent is extended or adjusted under 35 U.S.C. 154(b) by 15 days.

(21) Appl. No.: 16/513,697

(22) Filed: Jul. 16, 2019

(65) Prior Publication Data
US 2019/0341337 A1 Nov. 7, 2019

Related U.S. Application Data

(63) Continuation of application No. 15/959,297, filed on Apr. 23, 2018, now Pat. No. 10,431,524.

(51) Int. Cl.
*H01L 23/473* (2006.01)
*H01L 23/433* (2006.01)
*F28D 15/02* (2006.01)
*G06F 1/20* (2006.01)

(52) U.S. Cl.
CPC ........ *H01L 23/473* (2013.01); *F28D 15/0266* (2013.01); *F28D 15/0275* (2013.01); *G06F 1/20* (2013.01); *G06F 2200/201* (2013.01); *H01L 23/4332* (2013.01)

(58) Field of Classification Search
CPC ............... H01L 23/473; H01L 23/4332; F28D 15/0275; F28D 15/0266; F28D 2021/0029; F28D 1/035; G06F 1/20; G06F 2200/201; F28F 2250/08; F28F 9/26; H05K 7/20772
See application file for complete search history.

(56) References Cited

U.S. PATENT DOCUMENTS

| | | | | |
|---|---|---|---|---|
| 5,727,618 A | * | 3/1998 | Mundinger | F28F 3/086 165/185 |
| 6,658,861 B1 | * | 12/2003 | Ghoshal | F04B 17/00 62/3.7 |
| 6,708,501 B1 | * | 3/2004 | Ghoshal | H01L 23/473 165/104.19 |
| 7,002,801 B2 | * | 2/2006 | Zeighami | F28D 15/0266 165/104.33 |
| 7,672,129 B1 | * | 3/2010 | Ouyang | H01L 23/473 361/699 |
| 9,795,064 B2 | * | 10/2017 | Aoki | H05K 7/20772 |
| 10,431,524 B1 | * | 10/2019 | Lan | H01L 23/473 |
| 10,943,849 B2 | * | 3/2021 | Thorslund | H01L 23/467 |
| 2004/0112585 A1 | * | 6/2004 | Goodson | F28D 15/00 165/299 |
| 2004/0182088 A1 | * | 9/2004 | Ghoshal | H01L 23/552 62/3.7 |

(Continued)

*Primary Examiner* — Ljiljana V. Ciric
(74) *Attorney, Agent, or Firm* — Demian K. Jackson; Jackson IPG PLLC

(57) ABSTRACT

A water cooling module includes a flow-guiding main body and a pump set. The flow-guiding main body includes a first inlet, a first outlet and a flow-guiding passage set. The flow-guiding passage set includes a plurality of flow-guiding passages, and the first inlet and the first outlet are respectively communicable with one of the flow-guiding passages. The pump set includes a first pump having a first water inlet and a first water outlet, and a second pump having a second water inlet and a second water outlet. The first water inlet and the first water outlet are respectively communicable with one of the flow-guiding passages; the second water inlet and the second water outlet are also respectively communicable with one of the flow-guiding passages.

3 Claims, 12 Drawing Sheets

(56) References Cited

U.S. PATENT DOCUMENTS

| | | | | |
|---|---|---|---|---|
| 2004/0234392 | A1* | 11/2004 | Ghoshal | F04F 1/06 417/410.1 |
| 2005/0160752 | A1* | 7/2005 | Ghoshal | G06F 1/203 62/259.2 |
| 2005/0205241 | A1* | 9/2005 | Goodson | H01L 23/473 165/80.4 |
| 2005/0211417 | A1* | 9/2005 | Upadhya | F28D 15/0266 165/80.4 |
| 2006/0073024 | A1* | 4/2006 | Ghoshal | H02P 25/032 417/50 |
| 2007/0235180 | A1* | 10/2007 | Ouyang | G05D 23/20 165/287 |
| 2008/0314559 | A1* | 12/2008 | Hsu | G06F 1/20 165/80.4 |
| 2011/0272128 | A1* | 11/2011 | Suzuki | F28F 9/0214 165/185 |
| 2012/0285663 | A1* | 11/2012 | Wu | F28F 13/06 165/104.26 |
| 2013/0201628 | A1* | 8/2013 | Aoki | G06F 1/20 361/699 |
| 2013/0208421 | A1* | 8/2013 | Chester | H05K 7/20763 361/699 |
| 2014/0071622 | A1* | 3/2014 | Aoki | H01L 23/473 361/697 |
| 2014/0071624 | A1* | 3/2014 | Aoki | H05K 7/20263 361/699 |
| 2016/0330874 | A1* | 11/2016 | Sato | F28D 15/06 |
| 2016/0338223 | A1* | 11/2016 | Tsai | G06F 1/20 |
| 2017/0235350 | A1* | 8/2017 | Tsai | G06F 1/20 165/80.4 |
| 2018/0092247 | A1* | 3/2018 | Chiu | F28F 9/0221 |
| 2018/0092249 | A1* | 3/2018 | Chiu | F28D 1/047 |

\* cited by examiner

US 11,069,595 B2

WATER COOLING MODULE

The present application is a continuation of U.S. patent application Ser. No. 15/959,297, filed on Apr. 23, 2018.

FIELD OF THE INVENTION

The present invention relates to a water cooling module, and more particularly, to a water cooling module that avoids the problems of oxidized and leaked pipes and provides prolonged service life.

BACKGROUND OF THE INVENTION

Recently, water cooling modules have been widely used to dissipate heat produced by high-power heat sources. Since the water cooling modules provide relatively good heat dissipation efficiency, they are not only used to remove heat from desktop personal computers, but also widely applied to industrial computers and server system chasses.

A water cooling module mainly includes a water block, a pump and a water container; and these units are serially connected to one another via pipes, such that a working fluid for circulating through the water cooling module can successfully achieve the purpose of cooling one or more heat sources. In most cases, the pipes used to guide the working fluid are rubber pipes to provide required flexibility in use. The rubber pipes tend to oxidize or leak when they have been used over a long period of time, which will cause damage of cooling apparatus.

Metal pipes are sometimes used to replace the rubber pipes. While the metal pipes have longer service life and are not easily oxidized or broken compared to the rubber pipes, they must be connected to the water block, the pump and the water container by welding. Therefore, there are limits to the materials and the welding methods that can be adopted for the metal pipes used in the water cooling modules.

It is therefore very important to overcome the problem of oxidized and leaked pipes in the conventional water cooling modules.

SUMMARY OF THE INVENTION

A primary object of the present invention is to provide a water cooling module that avoids the problem of oxidized and leaked pipes found in the prior art water cooling modules.

To achieve the above and other objects, the water cooling module provided according to the present invention includes a flow-guiding main body and a pump set.

The flow-guiding main body includes a first inlet, a first outlet and a flow-guiding passage set. The flow-guiding passage set includes a plurality of flow-guiding passages, and the first inlet and the first outlet are respectively communicable with one of the flow-guiding passages.

The pump set includes a first pump having a first water inlet and a first water outlet, and a second pump having a second water inlet and a second water outlet. The first water inlet and the first water outlet are respectively communicable with one of the flow-guiding passages; and the second water inlet and the second water outlet are also respectively communicable with one of the flow-guiding passages.

By using the flow-guiding passage set in the flow-guiding main body to replace the conventional rubber or metal pipes used to connect to the pumps, the water cooling module according to the present invention can have a further reduced volume and avoids the problem of easily oxidized and leaked pipes.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 9b is an exploded bottom perspective view of the water block of FIG. 9a;

DETAILED DESCRIPTION OF THE PREFERRED EMBODIMENTS

Figure 1:
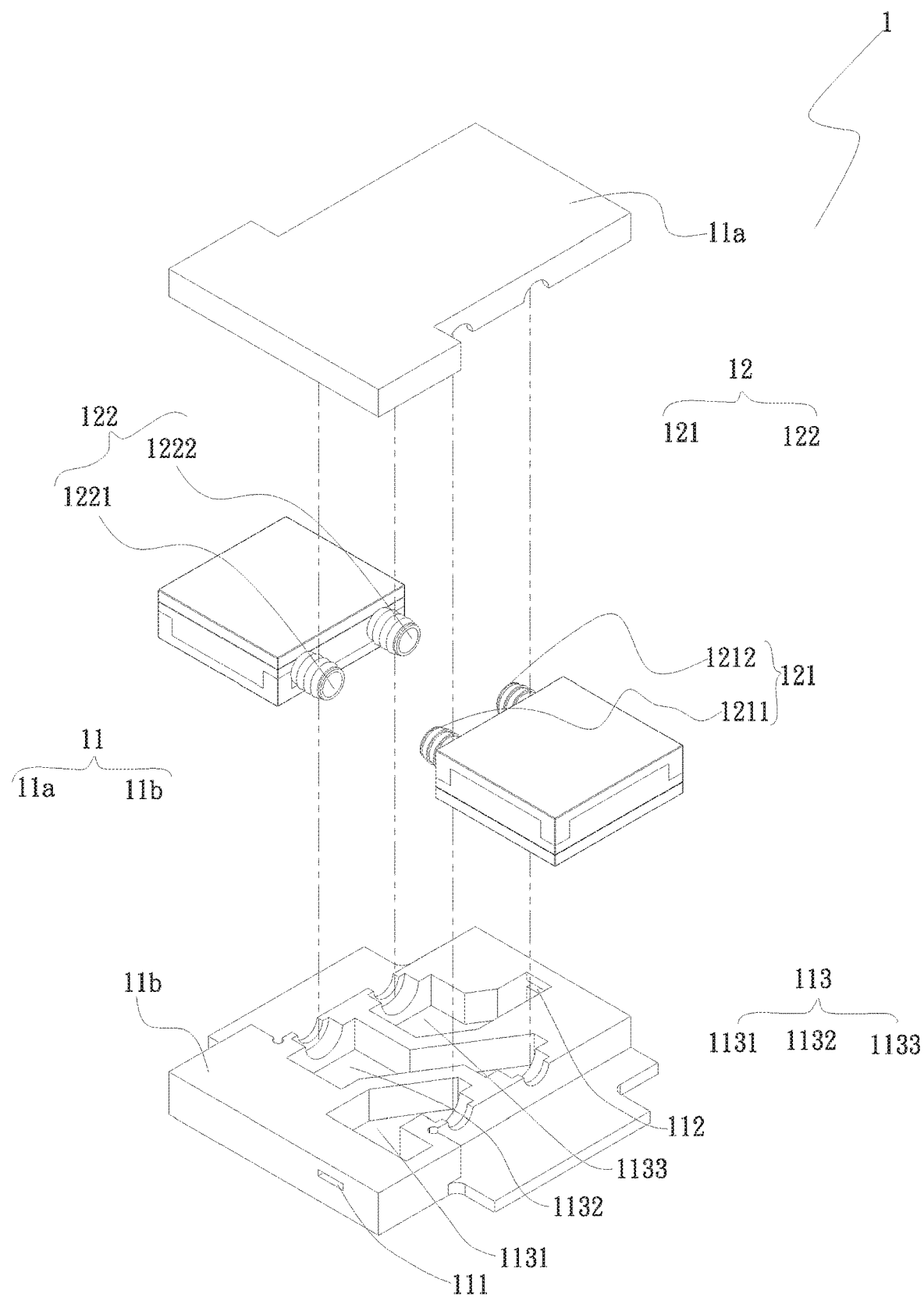
FIG. 1 is an exploded perspective view of a water cooling module according to a first embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 2:
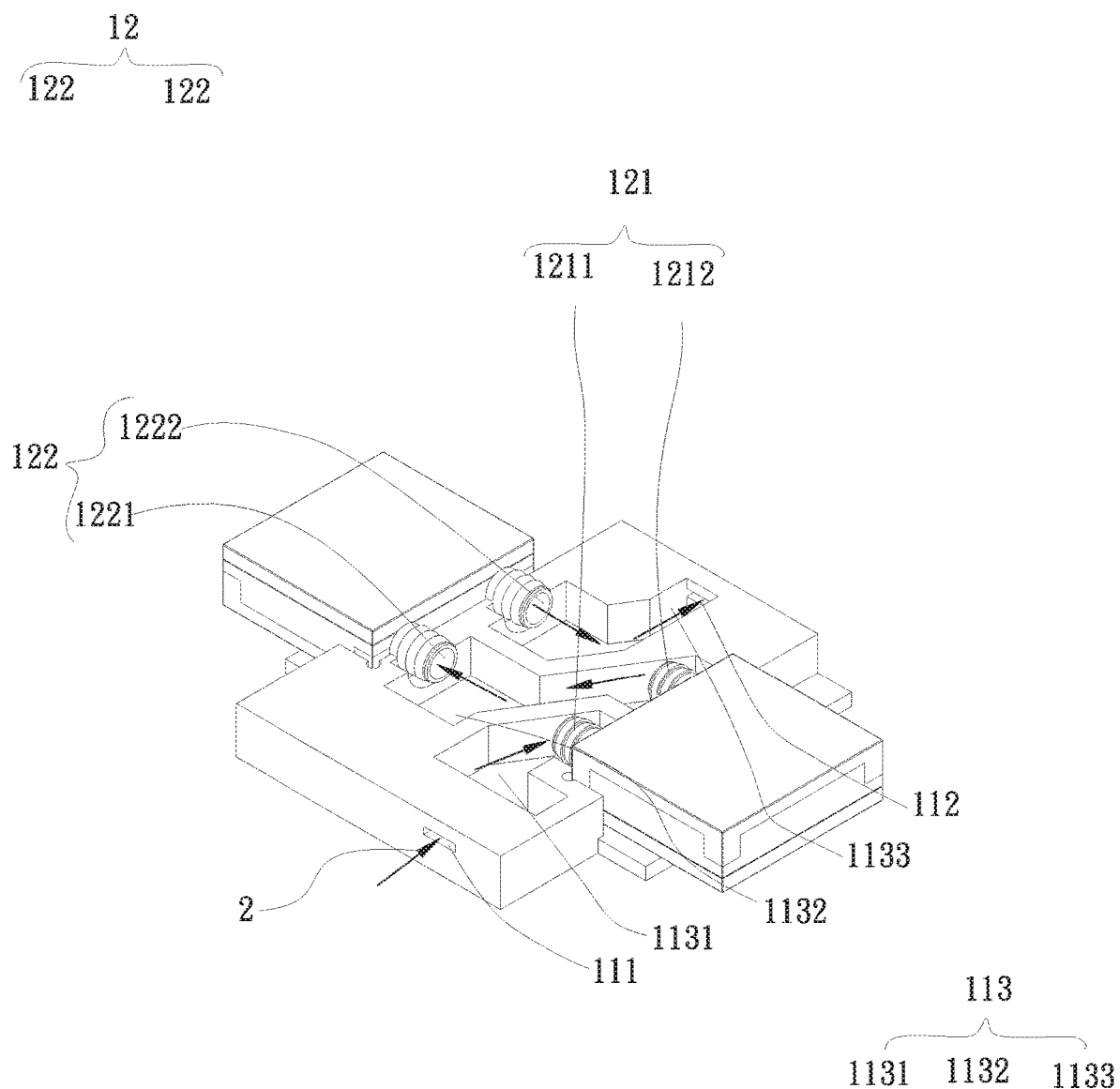
FIG. 2 is an assembled, partially sectioned perspective view of the water cooling module of FIG. 1.

Please refer to FIGS. 1 and 2 that show an exploded perspective view and an assembled, partially sectioned perspective view, respectively, of a water cooling module 1 according to a first embodiment of the present invention. As shown, the water cooling module 1 in the first embodiment includes a flow-guiding main body 11 and a pump set 12.

The flow-guiding main body 11 is composed of an upper part 11a and a lower part 11b, which are correspondingly closed to each other to together define a flow-guiding passage set 113 between them. More specifically, the flow-guiding passage set 113 is formed on a top side of the lower part 11b of the flow-guiding main body 11. On the flow-guiding main body 11, there are also provided a first inlet 111 and a first outlet 112. The flow-guiding passage set 113 includes a plurality of flow-guiding passages; and the first inlet 111 and the first outlet 112 are respectively communicable with one of the flow-guiding passages.

The pump set 12 includes a first pump 121 and a second pump 122. The first pump 121 has a first water inlet 1211 and a first water outlet 1212; and the second pump 122 has a second water inlet 1221 and a second water outlet 1222. The first water inlet 1211 and the first water outlet 1212 are respectively communicable with one of the flow-guiding passages. Similarly, the second water inlet 1221 and the second water outlet 1222 are respectively communicable with one of the flow-guiding passages.

The flow-guiding passage set 113 includes a first flow-guiding passage 1131, a second flow-guiding passage 1132, and a third flow-guiding passage 1133. The first flow-guiding passage 1131 is connected at two ends to the first inlet 111 of the flow-guiding main body 11 and the first water inlet 1211 of the first pump 121; the second flow-guiding passage 1132 is connected at two ends to the first water outlet 1212 of the first pump 121 and the second water inlet 1221 of the second pump 122; and the third flow-guiding passage 1133 is connected at two ends to the second water outlet 1222 of the second pump 122 and the first outlet 112 of the flow-guiding main body 11.

A working fluid 2, which can be water according to the present invention, enters the first flow-guiding passage 1131 via the first inlet 111 of the flow-guiding main body 11. The working fluid 2 is then guided by the first flow-guiding passage 1131 into the first pump 121 via the first water inlet 1211, and the pressure of the working fluid 2 is boosted in the first pump 121. Then, the working fluid 2 flows out of the first pump 121 via the first water outlet 1212 into the second flow-guiding passage 1132. The working fluid 2 is further guided by the second flow-guiding passage 1132 into the second pump 122 via the second water inlet 1221. In the second pump 122, the pressure of the working fluid 2 is boosted for a second time. Then, the working fluid 2 flows through the second water outlet 1222 of the second pump 122 into the third flow-guiding passage 1133 that communicates with the second water outlet 1222. Finally, the working fluid 2 is guided by the third flow-guiding passage 1133 to flow out of the flow-guiding main body 11 via the first outlet 112. In the first embodiment, the first pump 121 is serially connected to the second pump 122 via the flow-guiding main body 11 to enable serial water flow between them and achieve a flow pressure boosting effect through such serial connection.

Figure 3:
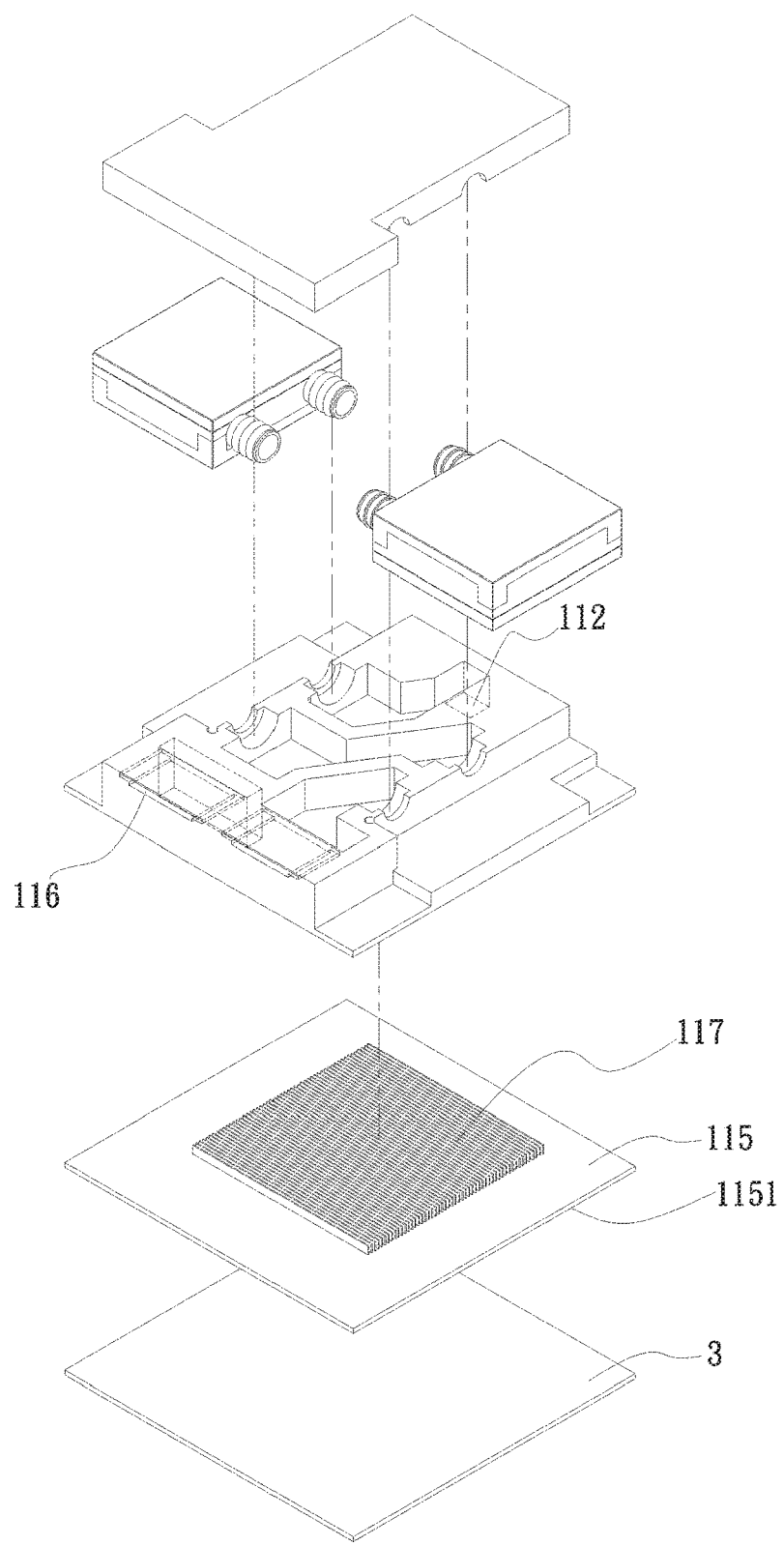
FIG. 3 is an exploded top perspective view of a water cooling module according to a second embodiment of the present invention.
Figure 4:
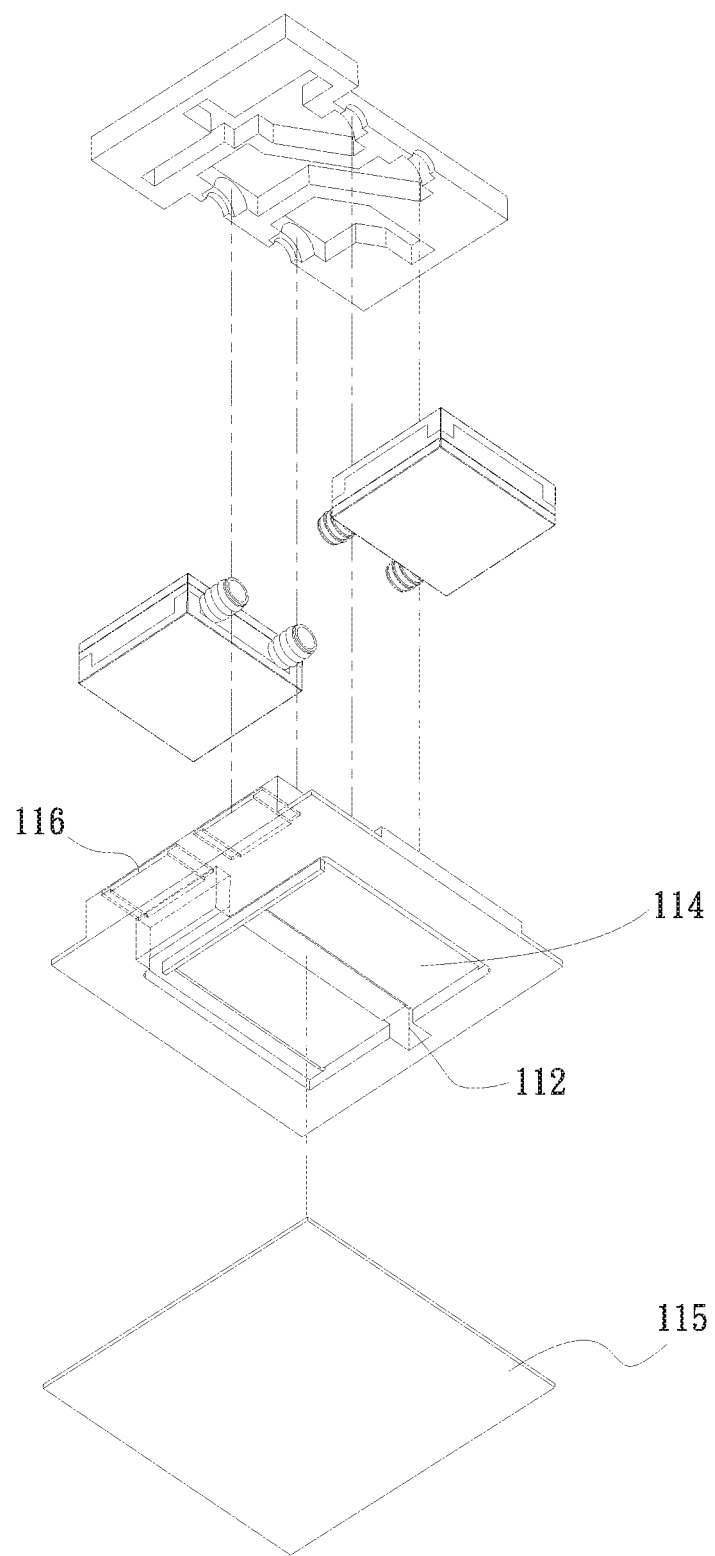
FIG. 4 is an exploded bottom perspective view of the water cooling module according to the second embodiment of the present invention.

Please refer to FIGS. 3 and 4, which are exploded top and bottom perspective views, respectively, of a water cooling module 1 according to a second embodiment of the present invention. As shown, the second embodiment is generally structurally similar to the first embodiment but the flow-guiding main body 11 thereof further includes a cavity portion 114, a plate member 115 and a second outlet 116. The cavity portion 114 is formed at a bottom side of the lower part 11b of the flow-guiding main body 11 to face away from the top side having the flow-guiding passage set 113 formed thereon. That is, the cavity portion 114 is downward opened. The cavity portion 114 is communicable with the first and the second outlet 112, 116; and the plate member 115 correspondingly closes the cavity portion 114. The plate member 115 has a plurality of radiating fins 117 formed on one side facing toward the cavity portion 114. Another side of the plate member 115 facing away from the radiating fins 117 is a heat-absorbing side 1151 for contacting with at least one heat source 3 to absorb heat produced by the heat source 3 and transfer the absorbed heat to the radiating fins 117. The working fluid 2 enters the cavity portion 114 via the first outlet 112 and then flows through the radiating fins 117 to finally flow out of the cavity portion 114 via the second outlet 116. Meanwhile, heat is carried away from the radiating fins 117 by the working fluid 2.

Figure 5:
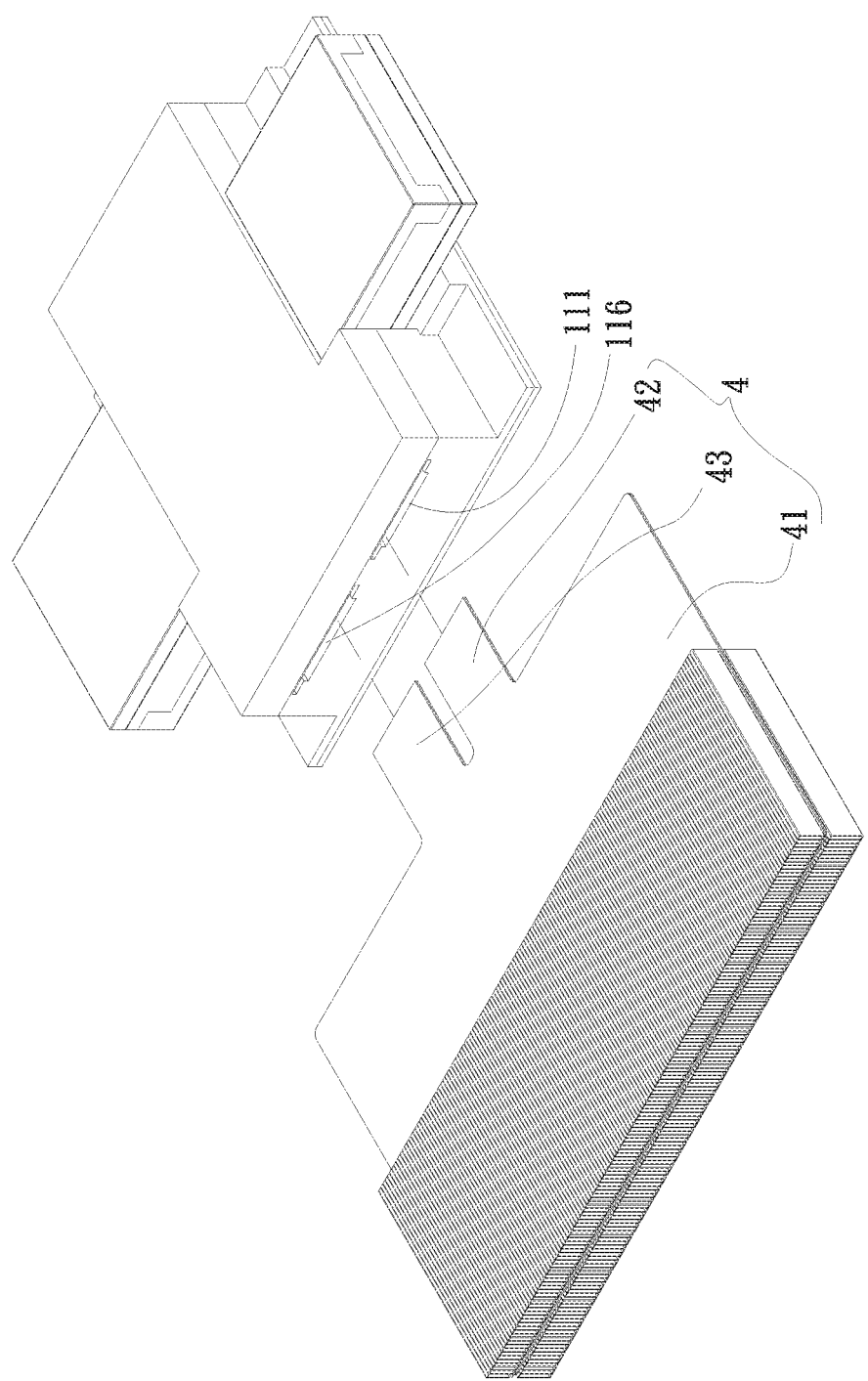
FIG. 5 is a partially exploded top perspective view of a water cooling module according to a third embodiment of the present invention.
Figure 6:
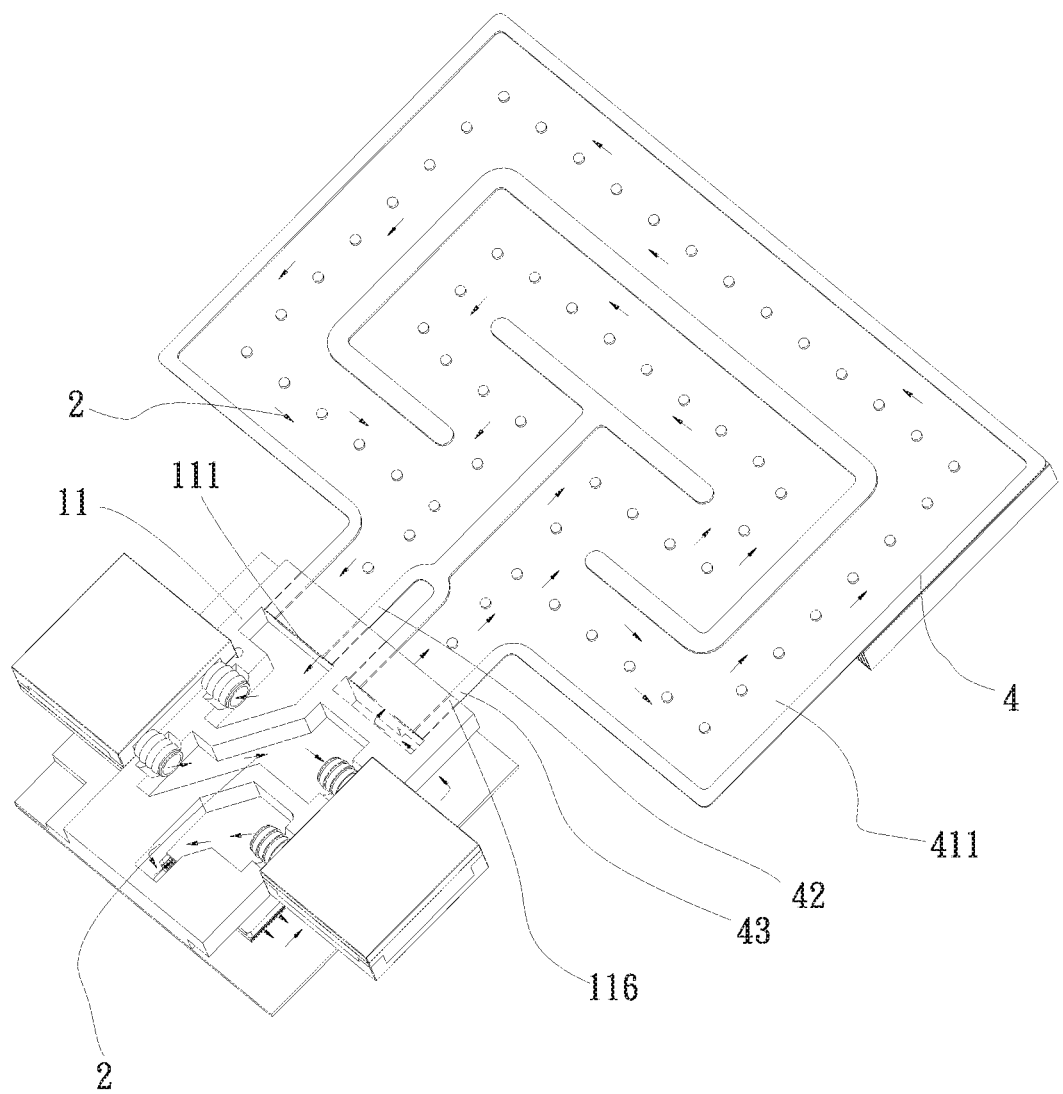
FIG. 6 is an assembled, partially sectioned perspective view of the water cooling module according to the third embodiment of the present invention.

Please refer to FIGS. 5 and 6, which show a partially exploded top perspective view and an assembled, partially sectioned perspective view, respectively, of a water cooling module 1 according to a third embodiment of the present invention. As shown, the third embodiment is generally structurally similar to the second embodiment but further includes a water cooling radiator 4. The water cooling radiator 4 includes a first water-receiving chamber 41, a first connecting portion 42, and a second connecting portion 43. The first water-receiving chamber 41 internally defines a first water-receiving space 411 communicable with the first and the second connecting portion 42, 43. The first and the second connecting portion 42, 43 are configured for connecting to the first inlet 111 and the second outlet 116, respectively. The water cooling radiator 4 is mainly used to cool the working fluid 2 that has absorbed heat. More specifically, the heat-carrying working fluid 2 flows out of the flow-guiding main body 11 via the second outlet 116 and then flows into the first water-receiving space 411 of the first water-receiving chamber 41 via the second connecting portion 43 that is connected to the second outlet 116. The heat-carrying working fluid 2 is cooled in the water cooling radiator 4 and then flows out of the first water-receiving space 411 via the first connecting portion 42 into the flow-guiding main body 11 via the first inlet 111, which is connected to the first connecting portion 42, to start another cycle of cooling circulation through the water cooling module 1.

Figure 7:
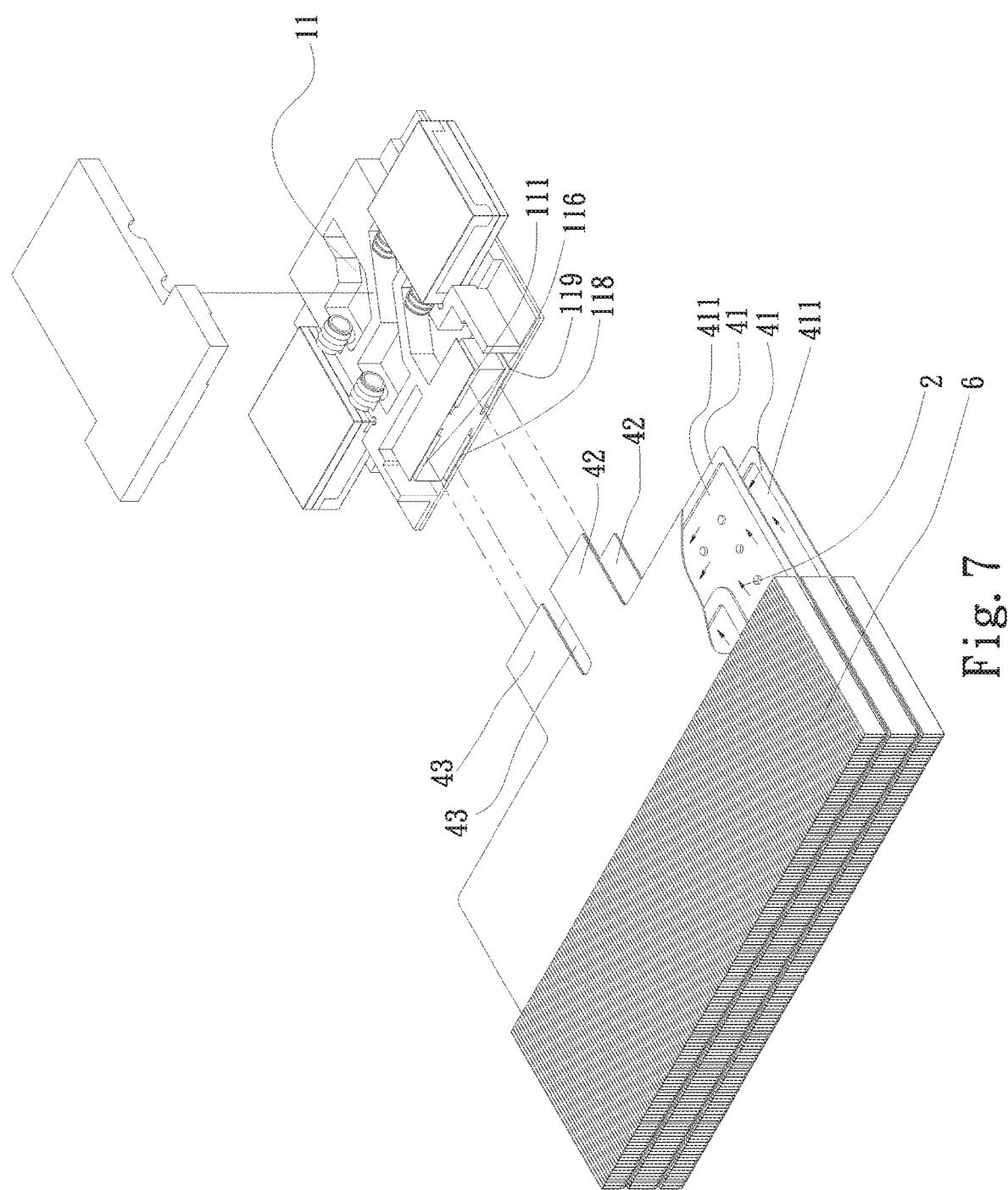
FIG. 7 is a partially exploded top perspective view of a water cooling module according to a fourth embodiment of the present invention.

FIG. 7 is a partially exploded top perspective view of a water cooling module 1 according to a fourth embodiment of the present invention. As shown, the fourth embodiment is generally structurally similar to the third embodiment but includes a plurality of water cooling radiators 4, which are sequentially stacked from top to bottom. In FIG. 7, there are shown two vertically stacked water cooling radiators 4. The fourth embodiment further includes a plurality of radiating fin assemblies 5, such that each of the water cooling radiators 4 is sandwiched between two of the radiating fin assemblies 5. In the fourth embodiment, the flow-guiding main body 11 is further provided with a second inlet 119 and a third outlet 118, which are located at the same side as the first inlet 111 and the second outlet 116. The first water-receiving spaces 411 of the water cooling radiators 4 are communicable with one another; the first and second connecting portions 42, 43 of one of the water cooling radiators 4 are connected to the first inlet 111 and the second outlet 116, respectively, while the first and the second connecting portions 42, 43 of the other water cooling radiator 4 are connected to the second inlet 119 and the third outlet 118, respectively. The water cooling radiators 4 are mainly used to cool the working fluid 2 that has absorbed heat.

According to the fourth embodiment, the water cooling radiators 4 can be three or more (not shown) in number without being particularly limited to any specific quantity.

Figure 8:
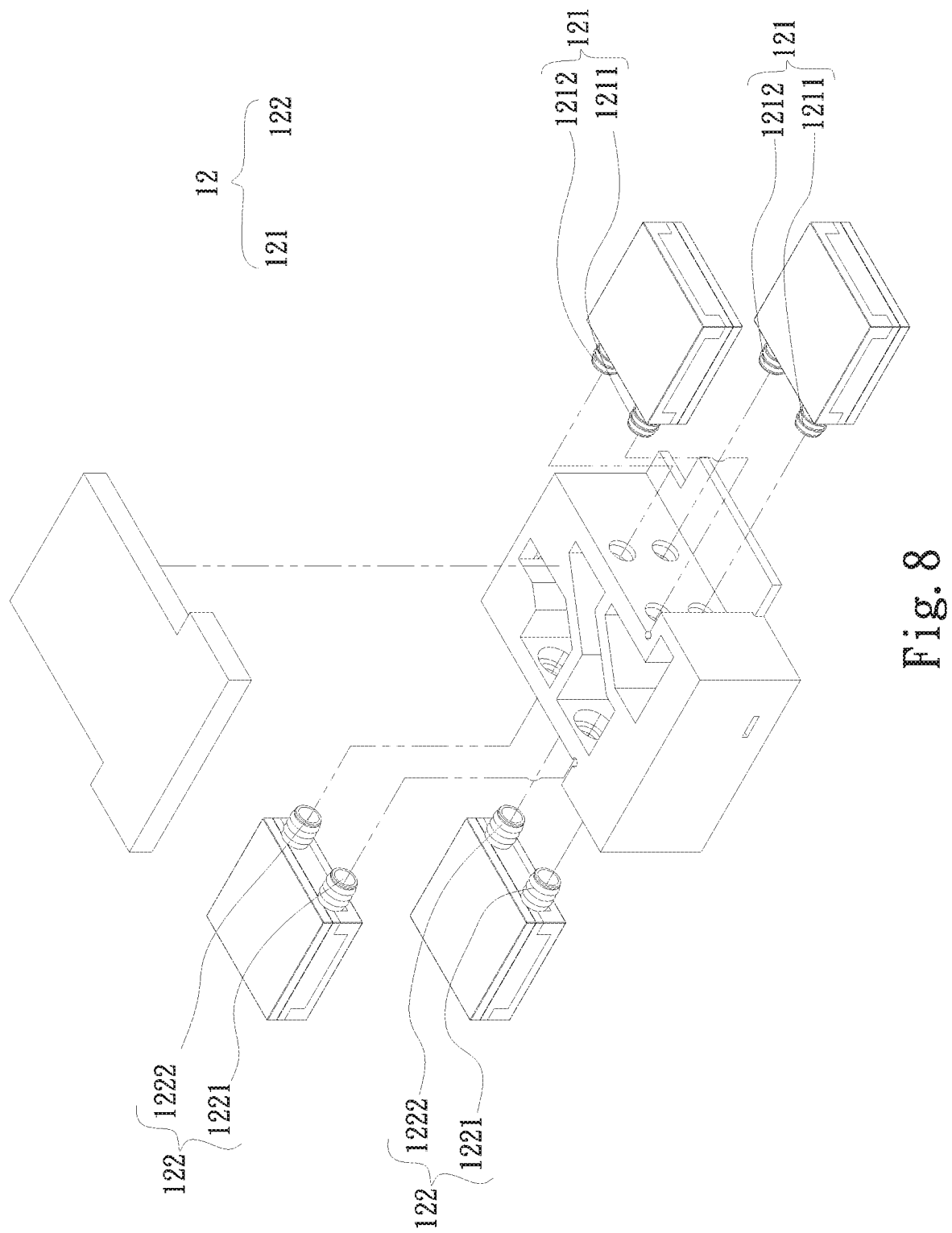
FIG. 8 is an exploded perspective view of a water cooling module according to a fifth embodiment of the present invention.

FIG. 8 is an exploded perspective view of a water cooling module 1 according to a fifth embodiment of the present invention. As shown, in the fifth embodiment, the pump set 12 of the water cooling module 1 includes a plurality of first pumps 121 sequentially stacked from top to bottom and a plurality of second pumps 122 sequentially stacked from top to bottom. Since the first water inlets and outlets 1211, 1212 of the first pumps 121 are arranged in the same manner as the first water inlet and outlet 1211, 1212 in the first embodiment, they are not repeatedly described.

Similarly, since the second water inlets and outlets 1221, 1222 of the second pumps 122 are arranged in the same manner as the second water inlet and outlet 1221, 1222 in the first embodiment, they are not repeatedly described.

In the fifth embodiment, the first pumps 121 are parallelly connected to the flow-guiding main body 11 and the second pumps 122 are also parallelly connected to the flow-guiding main body 11, such that the first pumps 121 are correspondingly serially connected to the second pumps 122 via the flow-guiding main body 11.

Figure 9A:
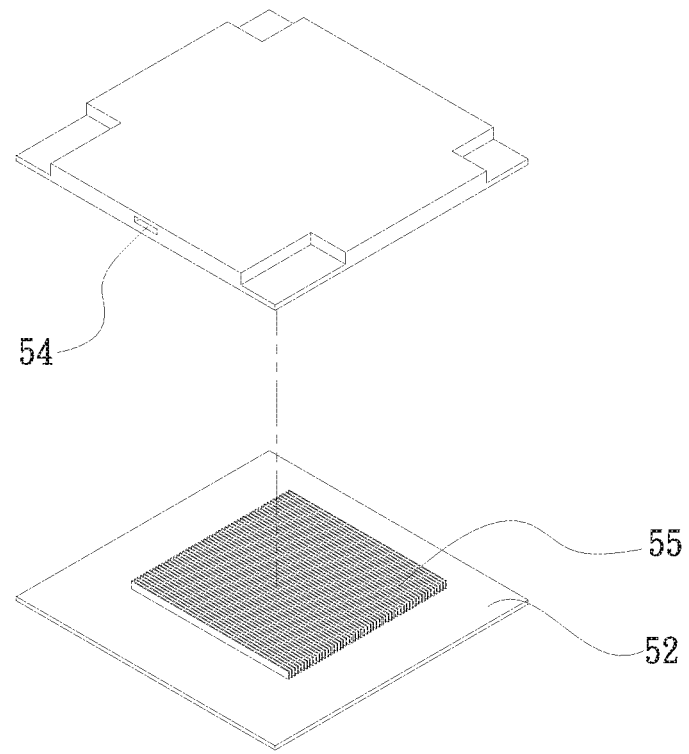
FIG. 9a is an exploded top perspective view of a water block included in a water cooling module according to a sixth embodiment of the present invention.
Figure 9B:
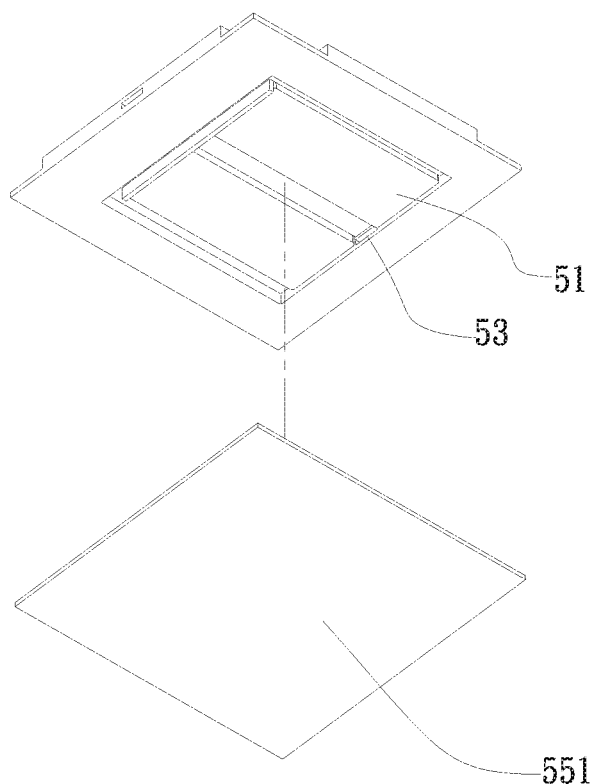
Figure 10:
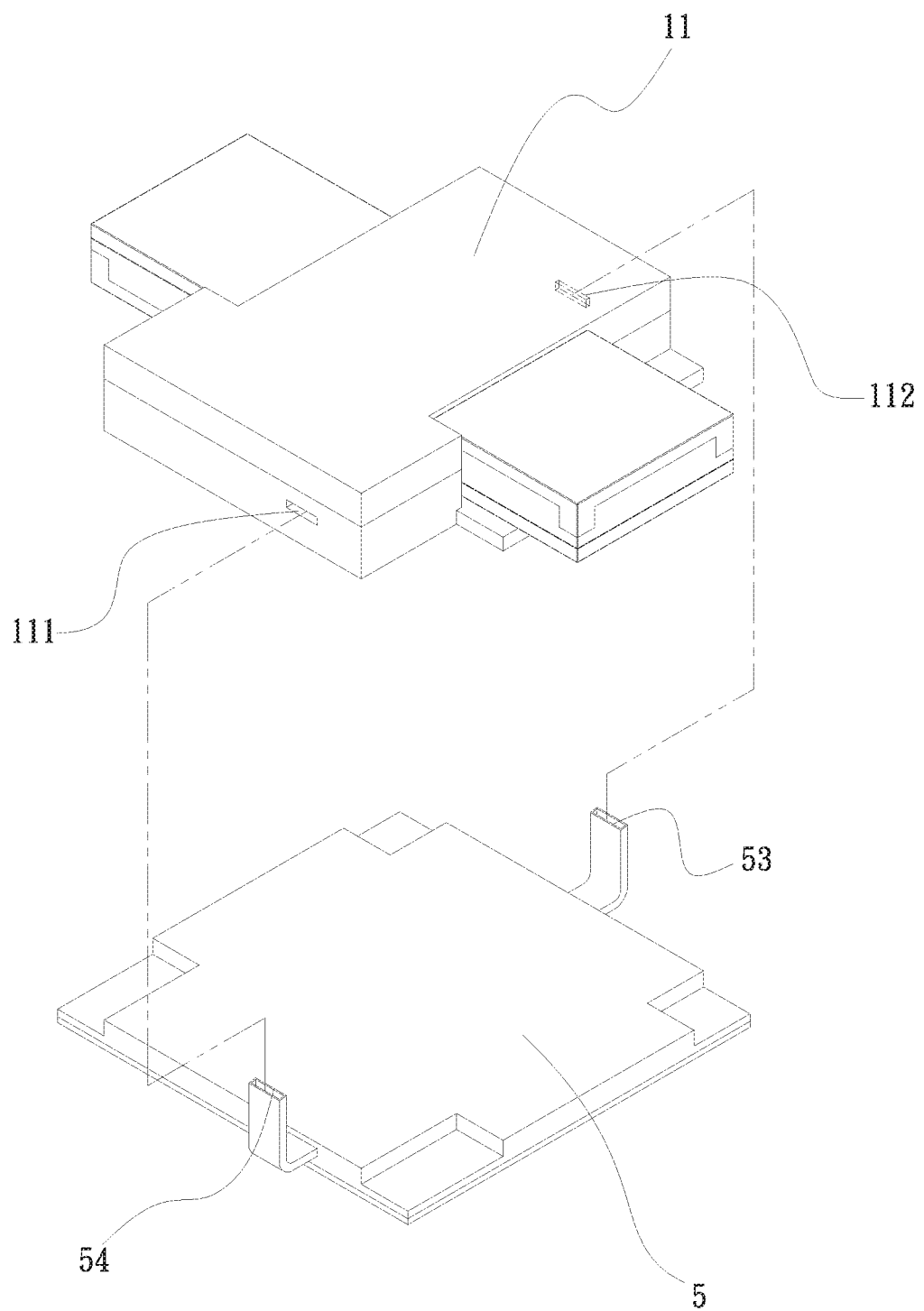
FIG. 10 is a partially exploded top perspective view of the water cooling module according to the sixth embodiment of the present invention.

Please refer to FIGS. 9a and 9b, which are exploded top and bottom perspective views, respectively, of a water block 5 included in a water cooling module 1 according to a sixth embodiment of the present invention, and to FIG. 10, which is an exploded top perspective view of the water cooling module 1 according to the sixth embodiment of the present invention. As shown, the sixth embodiment is generally structurally similar to the first embodiment but further includes a water block 5 serially connected to the flow-guiding main body 11. The water block 5 includes a heat-exchange water-receiving space 51, a heat-exchange plate member 52, and a water inlet 53 and a water outlet 54. The heat-exchange water-receiving space 51 has one open side and is communicable with the water inlet 53 and the water outlet 54. The heat-exchange plate member 52 correspondingly closes the open side of the heat-exchange water-receiving space 51. One side of the heat-exchange plate member 52 that faces toward the heat-exchange water-receiving space 51 is provided with a plurality of radiating fins 55, and another side of the heat-exchange plate member 52 that faces away from the radiating fins 55 is a heat-absorbing side 551 for contacting with at least one heat source (not shown). In the sixth embodiment, the water block 5 is serially connected to the flow-guiding main body 11, such that the water outlet 54 of the water block 5 is communicable with the first inlet 111 of the flow-guiding main body 11 and the water inlet 53 of the water block 5 is communicable with the first outlet 112 of the flow-guiding main body 11.

Figure 11:
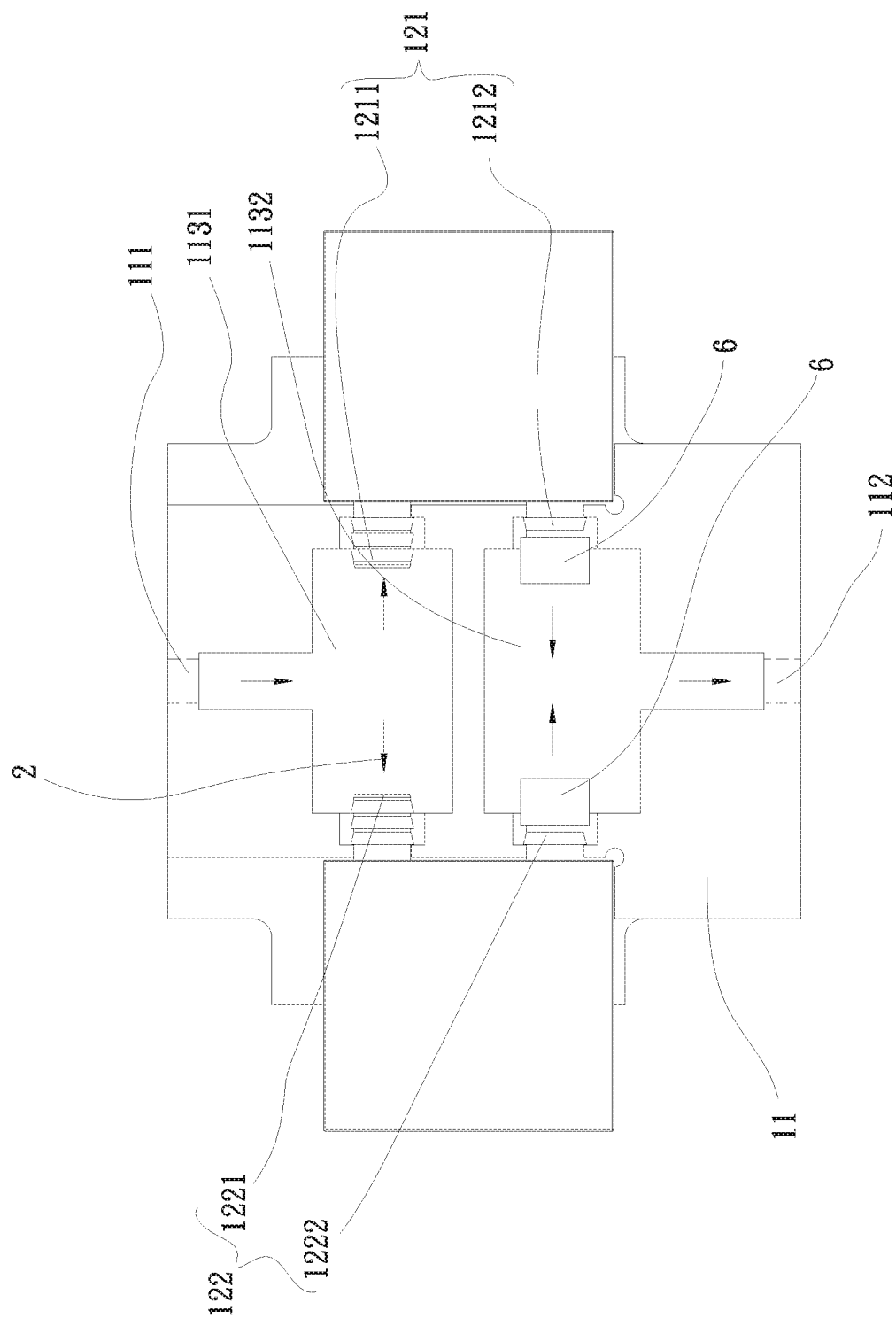
FIG. 11 is an assembled, partially sectioned top view of a water cooling module according to a seventh embodiment of the present invention.

Please refer to FIG. 11, which is an assembled, partially sectioned top view of a water cooling module 1 according to a seventh embodiment of the present invention. As shown, the seventh embodiment is generally structurally similar to the first embodiment but the flow-guiding main body 11 thereof has a flow-guiding passage set 113 including only a first flow-guiding passage 1131 and a second flow-guiding passage 1132. The first flow-guiding passage 1131 is connected at one end to the first inlet 111 of the flow-guiding main body 11 and at another end to the first water inlet 1211 of the first pump 121 and the second water inlet 1221 of the second pump 122. Similarly, the second flow-guiding passage 1132 is connected at one end to the first outlet 112 of the flow-guiding main body 11 and at another end to the first water outlet 1212 of the first pump 121 and the second water outlet 1222 of the second pump 122.

In the seventh embodiment, a check valve 6 is connected to the first water outlet 1212 of the first pump 121, and another check valve 6 is connected to the second water outlet 1222 of the second pump 122. When the working fluid 2 has flowed into the flow-guiding main body 11 via the first inlet 111, the working fluid 2 is firstly guided by the first flow-guiding passage 1131 into the first pump 121 via the first water inlet 1211 and into the second pump 122 via the second water inlet 1221 to enable an increased outgoing water quantity from the first and second pumps 121, 122. Then, the working fluid 2 leaves the first and the second pump 121, 122 via the first water outlet 1212 and the second water outlet 1222, respectively, into the second flow-guiding passage 1132. Finally, the working fluid 2 leaves the flow-guiding main body 11 via the first outlet 112. In the seventh embodiment, with the specific configuration of the flow-guiding passage set 113 of the flow-guiding main body 11, the first pump 121 is parallelly connected to the second pump 122 to thereby enable an increased outgoing water quantity. In the event any of the first and the second pump 121, 122 is failed, the check valve 6 connected to the failed pump can prevent the working fluid 2 in the second flow-guiding passage 1132 from flowing back into the failed pump 121 or 122.

According to any of the above-described embodiments of the present invention, the number of sets of the first and second pumps, either serially or parallelly connected to one another, can be increased without being particularly limited. Alternatively, some sets of serially connected first and second pumps can be provided along with some sets of parallelly connected first and second pumps.

With the water cooling module of the present invention, it is able to avoid the problems in the conventional water cooling modules, including the use of rubber pipes that tend to oxidize after having been used over a long period of time and the use of metal pipes that must be made of a suitable metal material to enable forming of good welded joints. Therefore, the water cooling module of the present invention has the advantages of providing prolonged service life and having a further reduced overall volume to enable easy application thereof.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A water cooling module, comprising:
   a flow-guiding main body being provided with a first inlet, a first outlet, a second inlet, a second outlet, a third outlet, a flow-guiding passage set and a cavity portion;
   the flow-guiding passage set including a plurality of flow-guiding passages, and the first inlet, the second inlet and the first outlet being respectively communicable with one of the flow-guiding passages, the cavity portion being formed on one side of the flow-guiding main body opposite to the flow-guiding passage set to have a downward open side and being communicable with the first outlet, the second outlet and the third outlet;
   a pump set including a first pump and a second pump; the first pump having a first water inlet and a first water outlet, and the second pump having a second water inlet and a second water outlet;
   the first water inlet and the first water outlet being respectively communicable with one of the flow-guiding passages; and
   the second water inlet and the second water outlet being respectively communicable with one of the flow-guiding passages; and
   a plurality of water cooling radiators vertically stacked, the plurality of water cooling radiators including a first water-receiving chamber, a first connecting portion, and a second connecting portion, respectively, the first water-receiving chamber internally defines a first water-receiving space communicable with the first and the second connecting portion, the first and the second connecting portion of the plurality of water cooling radiators being respectively communicable with the first inlet, the second outlet and the third outlet.

2. The water cooling module as claimed in claim 1, wherein the flow-guiding passage set includes a first, a second and a third flow-guiding passage; the first flow-guiding passage having two ends separately connected to the first inlet and the second inlet of the flow-guiding main body and the first water inlet of the first pump; the second flow-guiding passage having two ends separately connected to the first water outlet of the first pump and the second water inlet of the second pump; and the third flow-guiding passage having two ends separately connected to the second water outlet of the second pump and the first outlet of the flow-guiding main body.

3. The water cooling module as claimed in claim 1, wherein the flow-guiding main body is composed of an upper part and a lower part, which are correspondingly closed to each other to together define the flow-guiding passage set between the upper part and the lower part.

\* \* \* \* \*